United States Patent [19]

Mashikian et al.

[11] Patent Number: 4,887,041

[45] Date of Patent: Dec. 12, 1989

[54] METHOD AND INSTRUMENTATION FOR THE DETECTION, LOCATION AND CHARACTERIZATION OF PARTIAL DISCHARGES AND FAULTS IN ELECTRIC POWER CABLES

[75] Inventors: Matthew S. Mashikian, Storrs; Robert B. Northop, Chaplin; Rajeev Bansal, Willington, all of Conn.; Chrysostomos L. Nikias, Needham, Mass.

[73] Assignee: University of Connecticut, Storrs, Conn.

[21] Appl. No.: 216,132

[22] Filed: Jul. 7, 1988

Related U.S. Application Data

[63] Continuation-in-part of Ser. No. 157,416, Feb. 17, 1988.

[51] Int. Cl.$^4$ .............................................. G01R 31/08
[52] U.S. Cl. ...................................... 324/533; 324/541
[58] Field of Search ............... 324/532, 533, 534, 535, 324/541, 544, 523, 527

[56] References Cited

U.S. PATENT DOCUMENTS

| | | | |
|---|---|---|---|
| 2,628,267 | 2/1953 | Springfield et al. | 324/535 |
| 2,783,434 | 2/1957 | Babler | 324/532 |
| 3,244,975 | 4/1966 | Bauer | 324/533 |
| 3,255,406 | 6/1966 | Schluter | 324/533 |
| 3,281,673 | 10/1966 | Richardson | 324/532 |
| 3,440,528 | 4/1969 | Anderson | 324/533 |
| 3,588,611 | 6/1971 | Lamden et al. | 324/534 |
| 3,911,358 | 7/1975 | Shalyt | 324/532 |
| 3,991,364 | 11/1976 | Wiznerowicz | 324/533 |
| 4,013,948 | 3/1977 | Tanaka et al. | 324/535 |
| 4,063,165 | 12/1977 | Lanz | 324/533 |
| 4,104,582 | 8/1978 | Lambertson | 324/533 |
| 4,491,782 | 1/1985 | Bellis et al. | 324/533 |
| 4,499,417 | 2/1985 | Wright et al. | 324/533 |
| 4,766,386 | 8/1988 | Oliver et al. | 324/527 |
| 4,766,549 | 8/1988 | Scheitzer, III et al. | 324/533 |

Primary Examiner—Reinhard J. Eisenzopf
Assistant Examiner—Maura K. Regan

[57] ABSTRACT

A method and apparatus of detecting the locations of incipient faults in an insulated power line which comprises the method steps of opening one end of the power line, if it is not suitably terminated to reflect high frequency pulses, applying an excitation voltage to the other end of the power line at an excitation point, detecting a first high frequency pulse produced by a discharge in the power line and transmitted on the power line to the excitation point, detecting a first reflection of the pulse from the open end of the power line to the point of excitation, detecting the travel time of a reflection of the first pulse from the excitation point to the open end of the power line and return to the excitation point, and dividing the time between the detection of the first pulse and the first reflected pulse by the detected travel time. The invention also provides a method and means for only detecting discharge pulses which occur in a predetermined range of magnitude of the excitation voltage and discharge pulses which reside within predetermined ranges of magnitudes. The discharge sites may be detected using either reflected voltage or current pulses.

30 Claims, 2 Drawing Sheets

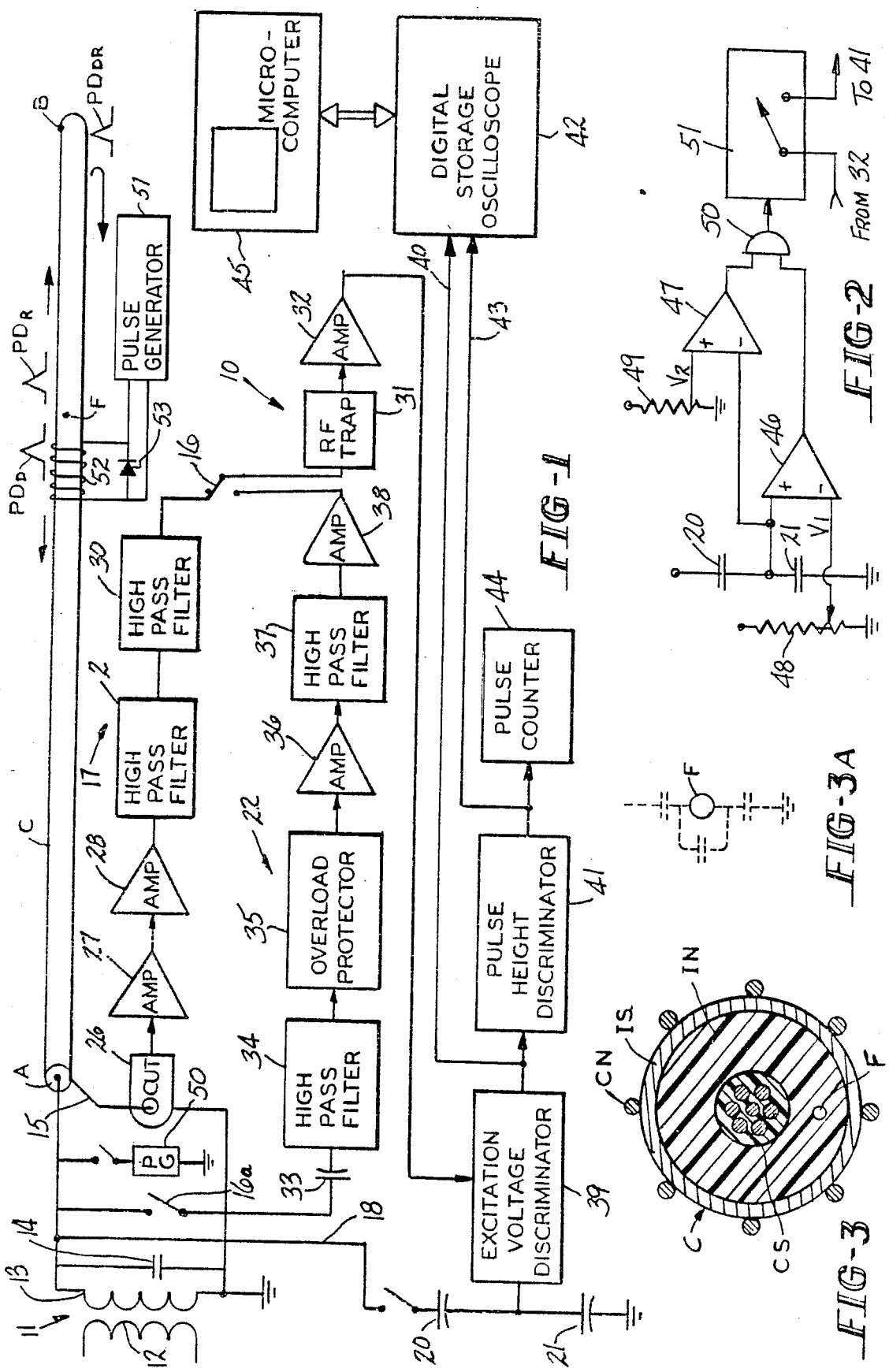

METHOD AND INSTRUMENTATION FOR THE DETECTION, LOCATION AND CHARACTERIZATION OF PARTIAL DISCHARGES AND FAULTS IN ELECTRIC POWER CABLES

CROSS-REFERENCE TO RELATED APPLICATION

The present application is a continuation-in-part of our copending application Ser. No. 07/157,416 filed Feb. 17, 1988.

FIELD OF THE INVENTION

This invention relates to a method and instrumentation for the detection, location, and also the characterization of partial discharges and faults in electric power cables, and provides a new method and instrumentation implementation thereof for monitoring the condition or status of an electric power cable.

BACKGROUND OF THE INVENTION

Insulated underground power cables are extensively used to transport electric energy from power generating plants or substations to load centers where the energy is required or to interconnect various electrical equipment in a plant or facility. Power cables used at elevated voltages, for example three thousand volts or more, basically consist of a central conductor surrounded by a thin concentric layer of a semi-conducting material which is referred to as a conductor shield. The conducting shield, in turn, is surrounded by a concentric layer of insulating material such as oil impregnated paper, polyethylene, or other polymers. This insulating material is covered by a second concentric semi-conducting layer referred to as an insulation shield over which a metal conductor is applied in the form of a thin helically wound concentric cylindrical wires or flat strips which provide a ground or neutral. This assembly may be covered by a thin electrically insulating jacket. Power cables designed to operate below three thousand volts and communication cables may not have semi-conducting shields and neutrals.

Insulated cables are intended to operate safely and effectively over lifespans exceeding thirty years. However, because of manufacturing defects, installation errors, or just normal aging under adverse conditions, cables may either develop incipient faults or completely fail to support the electric voltages imposed thereon. Incipient faults often manifest themselves by a phenomenon called "partial discharge" (PD). Because of a defect developing within or adjacent to the insulation of a cable, intermittent arcing (partial discharge) occurs within the insulation. As used herein, the term "partial discharge" refers to a fault within the cable which will not cause immediate failure but which may lead to eventual failure. The energies involved in this process are extremely small, and depending upon the type of insulating material, a more or less rapid localized deterioration of he material occurs. Eventually, incipient faults lead to a complete breakdown of the cable. Should this occur during a critical period, such as during a peak load for a utility or a critical manufacturing process for an industrial customer, the repercussions in terms of financial losses and customer inconveniences can be quite severe.

If users could monitor the condition of the cables and be able to pinpoint the location of defects and the severity of the defects, such users would be able to schedule non-use of the electric power during non-critical periods to effect the necessary repairs and avoid catastrophic breakdowns.

Assuming that a total cable failure occurs, it is an absolute necessity to locate the site of the fault as promptly as possible in order to perform rapid repairs. The methods used to locate cable faults need to be non-destructive, that is, they should not impose excessive stresses on the portions of cables which are not at fault, as this may create undue deterioration of the cable insulation. At the present time, no commercial instrumentation is known to be available which can locate and characterize cable incipient defects or faults in a non-destructive way in field installations. Some instruments exist which are able to detect the existence of a defect but not its location. Other instruments have been reported to be able to locate a fault in a cable while it is still in the factory, or in a well-shielded room. However, to use these known instruments, both cable ends must be accessible simultaneously, and the measurements will contain some ambiguity as to which end of the cable is taken as a reference to measure the location of the defect.

The location of faults in power lines has been addressed in the prior patent art. U.S. Pat. No. 2,628,267 measures the time of arrival of surge currents and reflections thereof emanating from a ground at a site in the cable. U.S. Pat. Nos. 3,244,975 and 3,255,406 disclose what is referred to as an impulse-reflection method of testing cables where the time difference of detection of transmitted and reflected pulses are measured to determine fault location. U.S. Pat. No. 4,104,582 measures the time by clocking a counter. U.S. Pat. No. 4,491,782 discloses a technique of recording impulse reflection where impulse reflection signals are measured during normal operation and also under fault conditions and makes a comparison after fault occurs to determine the location of the fault in a cable.

The known prior patent art appears to address the determination of only large faults which already will cause or have caused failure, and of incipient faults, which are sometimes referred to as partial discharges, in order to determine the remaining time of useful service of the cable.

Accordingly, the present invention provides a new and improved method and instrumentation for testing electrical power cables to determine the location of incipient faults therein and to determine the potential useful remaining life of the cable.

SUMMARY OF THE INVENTION

The present invention recognizes that partial discharges due to incipient faults in electric power cables occur at frequencies much higher than the frequency of the transmitted power. Partial discharges consist of a sequence of electrical voltage (or current) pulses of very short duration and at a repetition rate typically in the range of one hundred to five thousand kHz. The magnitude of the excitation voltage is typically several thousand volts, while that of the partial discharge signal is only in the range of millivolts. A further problem is presented by the fact that the cable environment in the field is infested with extraneous electrical signals (noise) of various frequencies, some of which fall within the frequency spectrum of the partial discharge signals, and having magnitudes which could approach that of the partial discharge signal. If the partial discharge signal is amplified, so are the noise signals, thus interfering with the measurement. The present invention thus uses techniques and instrumentation including filters and other electronic and signal analysis techniques to reduce the noise and enhance the desired signal.

Partial discharges are determined by detecting high frequency pulses on the line produced by an excitation voltage which may be sinusoidal or of other wave shape. When the partial discharge signals are collected, filtered and amplified, they are fed into a digital storage oscilloscope which converts the cyclically continuous electrical signals into a train of discrete digital signals which are stored in memory and/or perhaps on a computer diskette. A microcomputer reads the contents of the diskettes or of the digital storage oscilloscope memory and performs signal processing to pinpoint the location of the partial discharge.

In addition, the instrumentation package contains a pulse generator which sends a signal on the cable prior to seeking the location of the partial discharge site. The pattern, shape and magnitude of the reflected pulses are detected and fed to the digital storage oscilloscope or microcomputer for analysis. The result of this analysis is the determination of the cable characteristics, including length, attenuation and phase distortion. A composite of these characteristics is referred to as the cable transfer function. Determination of the cable transfer function enhances the ability to locate the partial discharge sites in the cable.

Another important novel feature of the invention is the provision of an excitation voltage discriminator so that one may look at partial discharges which occur in only a given range of amplitude of the excitation voltage. Since the excitation voltage is usually on the order of sixty Hz, or other relatively low frequency, the time of a half cycle is low, while the time of transmission of the partial discharge signals is in the order of microseconds. This enables one to observe partial discharges which occur only during selected amplitude windows of the excitation voltage.

Another feature of the invention is the use of a pulse height discriminator to select for viewing and/or recording only those partial discharge signals whose amplitudes are in a preset range of voltages or a preset window.

The last mentioned features, together with knowing the transfer function of the cable, permit one to determine the condition of the cable and how it will react to various magnitudes of applied voltage.

An object of this invention is to provide a new and improved method and apparatus for testing electric power cable for incipient faults before a failure occurs.

The features of the invention which are believed to be novel are particularly pointed out and distinctly claimed in the concluding portion of this specification. The invention, however, together with further objects and advantages thereof, may best be appreciated by reference to the following detailed description taken in conjunction with the drawings.

BRIEF DESCRIPTION OF THE DRAWINGS

FIG. 1 is a schematic block diagram of a system embodying the invention;

FIG. 2 is a schematic representation of the circuit shown in block form in FIG. 1;

FIG. 3 is a cross-section through a typical underground 15 kilovolt distribution cable;

FIG. 3a is a simplified schematic diagram of an incipient fault in a cable;

DETAILED DESCRIPTION OF THE ILLUSTRATED EMBODIMENTS

Figure 5:
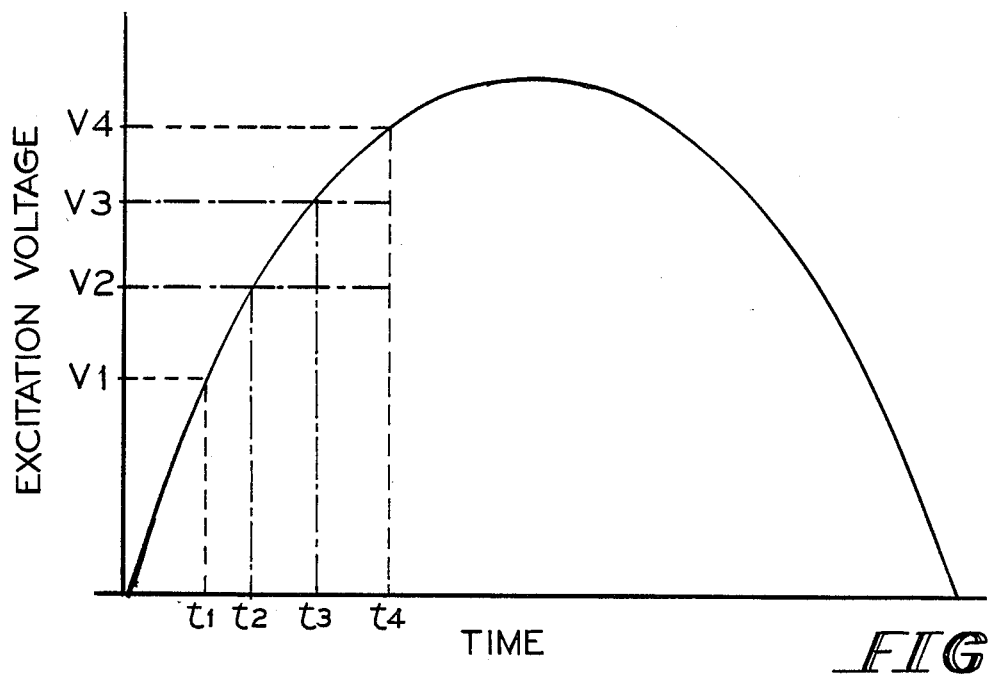
FIG. 5 is a diagram of a half cycle of the excitation voltage utilized in the invention, illustrating the manner in which pulse discharges may be determined at various magnitudes of the excitation voltage.

Reference is first made to FIG. 1 which exemplifies a system embodying the invention. Shown in FIG. 1 is a representation of a cable C having ends A and B. Assuming there is a fault or defect in the cable denoted by the reference character F and a partial discharge occurs, such partial discharge will be in the range of 100 kHz to 5000 kHz. This will produce a pulse which will travel in two directions. The pulse which must be considered as a plurality of pulses are designated as $PD_D$ and $PD_R$. Pulse $PD_D$ will travel toward end A. Pulse $PD_R$ will travel toward end B which has been terminated so as to produce reflection. Pulse $PD_D$ will also be reflected to end B and then re-reflected as a pulse $PD_{DR}$ back toward end A. The time difference in the receipt of these three pulses at end A is utilized to calculate the location of the fault, as will hereinafter be explained.

A system embodying the invention may be utilized to detect partial discharges by either current analysis, or voltage analysis.

An excitation voltage is applied to end A of cable C from a parallel resonant transformer 11 having a primary 12 and a secondary 13. The capacitance of the cable is indicated by the reference numeral 14. The inductance of the secondary coil 13 is variable and can be adjusted to resonate with capacitance 14. This arrangement may be utilized if end B of cable C is opened. Alternatively, the inspection may be made with line power applied. In either case, the voltage applied to the end A of cable C is termed "excitation voltage". In the case shown where end B is opened, the excitation voltage will be normally at or below the level of the normal line voltage to avoid harming the cable insulation. However, if desired, this level could be exceeded. It will not be necessary to open end B if it is suitably terminated to reflect high frequency pulses, and the excitation voltage is normal line voltage. A transformer presents a high impedance and will reflect partial discharge signals. Preferably, a low pass filter (not shown) is inserted in primary side of transformer 11 to reduce power line spikes such as may be generated by silicon controlled rectifiers.

Reference is briefly made to FIG. 3 which exemplifies in cross-section the cable C. The cable C comprises a central stranded conductor SC surrounded by a thin concentric layer of a semi-conducting material known as a cable shield CS and an insulating material IN, such as oil impregnated paper, polyethylene, or other polymers. The insulation IN is covered by a second concentric semi-conducting layer, termed an insulation shield IS, over which a metal conductor is applied in the form of a thin tape, helically wound concentric cylindrical wires, or flat straps identified by the reference CN. FIG. 3 also exemplifies an incipient fault F in the cable insulation IN.

FIG. 3a exemplifies the effect of the incipient fault F in the cable. Looking at the path from the stranded conductors to ground, one may consider three capacitances C1, C2, and C3. However, if the air in the fault F ionizes, capacitance C2 disappears and becomes a resistance. Repeated discharges or partial discharges increase the magnitude of the fault F and can lead to eventual breakdown of the insulation IN of cable C. The air in the fault F will ionize at three kilovolts per millimeter at atmospheric pressure.

When the cable C is excited with the excitation voltage, and a partial discharge occurs, there will be current pulses transmitted over the conductors CN. These pulses are of a high frequency and will travel on the conductors CN. At end A, these pulses are applied over line 15 to a current pulse detecting channel 17. The excitation voltage is also detected on a line 18 and applied to a voltage divider comprising capacitances 20 and 21 for purposes hereinafter described. The current detecting channel 17 comprises a current-to-voltage transformer 26 which outputs to cascaded broad-band, low noise amplifiers 27 and 28, whose output is applied to high pass filters 29 and 30. The filters 29 and 30 are designed to eliminate low frequency (power line signals) spikes, etc. A filtered signal is then passed through an adjustable radio frequency (RF) trap 31 to remove any interference from any radio broadcasting stations. Thereafter, the received signals are applied to a buffer amplifier 32. Alternatively, the partial discharge voltage pulses are detected and applied through a high voltage coupling capacitor 33 to a voltage detecting channel 22, which comprises a high pass filter 34, which attenuates −3 dB at 6 kHz and falls off to −150 dB at 60 Hz, an overvoltage protector 35, and a low noise broad-band amplifier 36, a second stage of filtering provided by high pass filter 37, which attenuates −3 dB at 100 kHz and falls off to about −180 dB at 60 Hz. The output of filter 37 is applied to radio frequency trap 31, and hence to buffer amplifier 32.

It will be understood that either the current channel 17 or the voltage channel 22 may be utilized in practice of the invention, but not concurrently. The selection is made by switch 16. This would be determined by which of switches 16 and 16a is closed. The output of amplifier 32 is applied to an excitation voltage discriminator 39 which also receives an input of reduced excitation voltage from a voltage divider comprising capacitors 20 and 21. The output of the excitation voltage discriminator 39 is applied over line 40 to a digital storage oscilloscope (DSO) 42, and is also applied to a pulse height discriminator 41, which supplies an output over line 43 to DSO 42 and also to a pulse counter 44. The DSO 42 also communicates with a microcomputer 45. The microcomputer is provided to work on data stored in DSO 42.

A Nicolet Model 4094A DSO manufactured by Nicolet Corporation of Madison, Wis. utilized in practice of the invention, is capable of digitizing the analog partial discharge signals. This Nicolet DSO, in addition to having a high resolution wave form digitizer, has a memory buffer, a general purpose instrumentation bus interface to communicate with microcomputer 45, a trigger generator and the ability to communicate with a microcomputer to supply data for computation. In addition, the DSO is able to perform Fourier frequency spectrum analysis. The trigger of the DSO is electronically coupled to the outputs of the excitation voltage discriminator 39 and the pulse height discriminator 41. The microcomputer 45 is an IBM PC/XT or equivalent, or a higher grade microcomputer.

A pulse generator (PG) 50 is provided to apply pulses to the cable C to enable determination of the cable transfer function, as hereinafter described. Pulse generator 50 may also be utilized in a known pulse echo technique to locate low impedance fault to ground as disclosed in the previously discussed prior patent art.

Where a cable is buried in a trench, the length of the cable may be longer than the trench due to undulations or "snaking" of the cable in the trench when it is laid. Therefore, while the distance to the location of the position of a fault in the cable may be detected in terms of cable length, such position may not correspond to the same length of the trench. The length of the trench has previously been recorded by the utility company or cable installer and is data of record. For example, assume that a pulse discharge site is found to be located at approximately seventy-five percent of the cable length from end point A, as approximated in FIG. 1. A small test hole is dug in the ground at this assumed percentage of the trench length until the cable is uncovered. This position of the cable is generally different from the seventy-five percent cable length position sought. To determine the exact position of this location with respect to the cable, a non-destructive electrical signal is injected at this location by means of a voltage pulse generator 51 which applies a pulse to an inductive coil 52 which has been wound around the cable C. This signal is induced in the neutral conductors CN and travels both directions along the cable behaving exactly like a pulse discharge signal. A succession of pulses similar to the PD pulses are received at the instrumentation channel 17, are amplified as previously explained, and recorded by the digital storage oscilliscope 42. The position along the trench in percent of cable length is determined by dividing the time between the current pulses $PD_D$ and $PD_R$ by the distance between $PD_D$ and $PD_R$, as previously described.

The system operator now knows the following:
1. The length along the cable from point A to the partial discharge site (D);
2. The length along the cable from point A to the induced pulse site (DT).
3. The length along the trench from point A to the induced pulse site (T).

From this, he may calibrate the length of cable as a function F(T) of trench length or $$\frac{DT}{T} = F(T)$$

Then, $\dfrac{D}{F(T)}$ will give the probable location of the pulse discharge site in terms of trench length. If the partial discharge site is not accurately located with the first induced pulse, then another induced pulse may be applied at a location closer to the partial discharge site and the above calculations again made.

Alternatively, the distance along the trench between the partial discharge site and the site of the induced pulse ($D_1$) may be calculated as follows:

correct formula:

$$D_1 = \frac{D - DT}{F(T)} \quad D_1 = \frac{(D - DT)}{F(T)}$$

The foregoing assumes that the included pulse site was closer to point A than the partial discharge site.

The cable is then exposed, a portion including the pulse discharge site is removed and a splicing cable substituted for the cable portion removed.

The pulse induced in the neutral conductor CN need only be greater than any ambient noise and may be as low as ten to fifteen volts.

The diode 53 in circuit with pulse generator 51 facilitates rapid switching of the current in coil 52. The coil 52 can either be hand wound in the field once the cable C is exposed, or may be a pre-wound device that can be connected about cable C when it is exposed.

Reference is made to FIG. 5 to exemplify the action of the excitation voltage discriminator 39 during a half cycle of the excitation voltage. The excitation voltage discriminator may be set to look only for voltages due to partial discharge during predetermined amplitude ranges of the excitation voltage. For example, at times $t_1$ and $t_2$, the excitation voltage discriminator will only look for the voltage range $V_1$ to $V_2$; during the times $t_2$ to $t_3$, the excitation voltage discriminator 39 will only look at the voltage range $V_2$ to $V_3$; and from time $t_3$ to $t_4$, the excitation voltage discriminator 39 will only look at voltage range $V_3$-$V_4$. The reason for detecting partial discharge at only predetermined amplitudes of the excitation voltage will be hereinafter described.

FIG. 2 schematically represents excitation voltage discriminator 39, which comprises, in summary form, voltage comparator 46, such as an LM311, receiving a non-inverting input from the AC, high-voltage divider comprising capacitors 20 and 21, and also an inverting input from a variable DC threshold voltage, derived from potentiometer 48. The attenuated AC excitation voltage signal is also an inverting input to a second comparator 47, which receives a non-inverting DC threshold voltage from potentiometer 49. The outputs of the two comparators are inputs to an AND gate 50. The output of gate 50 goes high only when the attenuated AC excitation signal lies between predetermined voltage values. When the output of gate 50 goes high, a MOS analog signal transmission gate (such as 4016B) 51 closes, allowing PD signals to pass from buffer amplifier 31 to the pulse height discriminator 41 and the DSO 42. By varying the threshold inputs from potentiometers 48 and 49, various voltage ranges of the excitation voltage may be selected and used to propagate only those pulse discharge signals occurring in that voltage range to apparatus for recording, storage, and analysis. This may be done manually, or by programmed output from microcomputer 45.

Similarly, the operator may wish to record pulses in only a given magnitude range by setting the "window" for pulse height discriminator 41. Pulse counter 44 may then be utilized to count the number of pulses during a given time span.

Figure 4:
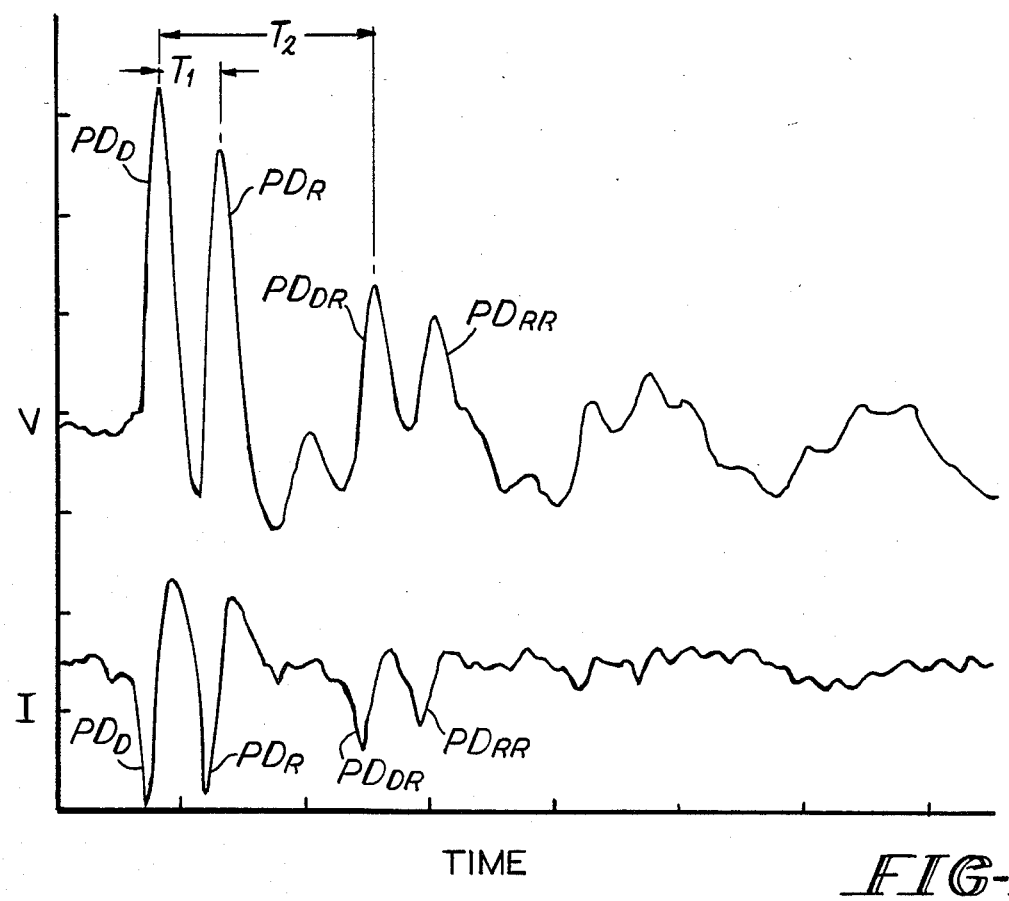
FIG. 4 depicts two wave forms which result from the detection of partial discharges.

Reference is now made to FIG. 4 which exemplifies the wave form detected using either the current detection technique or the voltage detection technique. The upper diagram is the voltage, and shows the pulses $PD_D$; $PD_R$; and $PD_{DR}$ with respect to time. The current wave form shows the same pulses, but inverted. The time between receipt of the first partial discharge pulse $PD_D$ and the second $PD_R$ is given by the time $T_1$, while the time between reflection of pulse $PD_D$ from point A, traveling to point B, and return to point A, is $T_2$. It may be noted that the time $T_2$ is a measure of twice of the distance of the line, while the time $T_1$ is a measure of two times the distance from the fault F to the end B. Thus, the fault location is $T_1/T_2$ times the length of the cable from end B.

The PD pulses will continue to be reflected from the ends of the line and, with time, will decrease in amplitude and suffer phase distortion and broadening base with continuing reflections.

The partial discharges may occur at different threshold values of excitation voltage and there may be a plurality of partial discharge sites. Therefore, by looking at discrete ranges of the excitation voltage, the system operator may discriminate against some partial discharges to investigate others. He may also allow the DSO to trigger, repeatedly, on different pulses, examining, each time, the pattern of the recorded signals such as in FIG. 5. Different patterns (times of occurrence of peaks) denote that the PD site is different. The pulse height discriminator has the additional ability to eliminate certain noises associated with the excitation voltage power supply, namely, those occurring repeatedly at the same time location on the excitation voltage wave.

The pulse height discriminator 41 further provides a means of further discrimination on the basis of pulse height. Hence, the system operator may gather data on only one partial discharge site while at least for a time, ignoring others.

A given partial discharge will be repetitious with each cycle of the excitation voltage.

If the partial discharge signals received emanate from more than one site, it is highly probable that the amplitudes within signals emanating from different sources are dissimilar. Therefore, the DSO 42 may be triggered on pulse discharge signal magnitude falling within a preselected range of amplitudes determined by pulse height discriminator 41. By gradually changing this range, it is possible to force DSO 41 to respond sequentially to partial discharge signals from different sites and thus effect a separation of the various signal sites. Another beneficial effect of this feature is discrimination against noise if magnitude falls outside the preselected voltage range. A byproduct of this feature is the ability to perform a statistical analysis of the partial discharge signal magnitudes which would be a component of partial discharge signal characterization.

The provision of excitation voltage discriminator permits the determination of the magnitude(s) of the excitation voltage required to cause partial discharges. It will be apparent that partial discharges at lower excitation voltages are likely to be due to more severe faults.

The pulse height discriminator will provide information on the severity of faults by determining the number of the partial discharge pulses with amplitudes lying within a given range of voltages. It will be appreciated that the excitation voltage discriminator may be set with a window which will include the total magnitude of the excitation voltage. Then the pulse height discriminator may be set for different ranges and counter 44 will record the number of partial discharges in a particular voltage magnitude range.

As previously discussed, the detected pulses are susceptible to being marked by extraneous noise. The invention provides the following methods of noise reduction:

1. Signal averaging—This is accomplished by triggering the DSO repeatedly on the same partial discharge and averaging a multiplicity of signals. The partial discharge signal, which consistently occurs at the same location on the time axis and tends to remain intact, while the average of random noise tends to cancel.

2. Digital low pass filtering—This feature is incorporated in a program available with the aforementioned DSO. It reduces broad-band random noise from the partial discharge signals after the received wave form is digitized.

3. Rejection of artifacts and reinforcement of partial discharge related signals. This technique is achieved by use of a light pen or mouse-driven cursor window in conjunction with the CRT display of the microcomputer. By pointing the light pen at an unwanted signal on the CRT or bracketing it with the cursor, the operator will be able to remove the unwanted signal and obtain a clean PD signal.

4. Processing the digitized PD signal through a digital filter using the information generated by the cable transfer function as hereinafter described.

Every cable has a transfer function given by the following equation $$H(f) = \frac{V_x(f)}{V_o(f)} = e^{-ax} \cdot e^{-jbx}$$

where
  $V_o(f)$ is the original discharge voltage produced at the site of a cable defect, expressed as a function of frequency (f) by means of a Fourier analysis
  $V_x(f)$ is the discharge signal received at the excitation end after it has traveled a distance x from the discharge site
  a is the attenuation of the cable, measured in Nepers per unit length
  b is the phase constant of the cable, measured in radians per unit length.

The values of a and b, both dependent on frequency, are obtained either in the laboratory using a cable similar to the one tested in the field, or in situ.

In the laboratory, a cable of known length Is connected at one end to a radio frequency (RF) impedance analyzer, which is capable of measuring the impedance of the cable at various frequencies (f). A suitable instrument is a Hewlett-Packard Model 4191A.

For each frequency, the following complex impedances are measured where
  $Z_o$ = impedance of the cable when remote end is open circulated
  $Z_s$ = impedance of the cable when remote end is short circuited $$a + jb = \frac{1}{2L} \ln \left[ \frac{Z_o + \sqrt{Z_o Z_s}}{Z_o - \sqrt{Z_o Z_s}} \right]$$

In situ, a pulse generator (PG) 50 (FIG. 1) is connected to the excitation end A of a cable C while the remote end is open. The pulse generator provides pulses with adjustable periods therebetween. This period is adjusted to a time which is usually greater than the round trip travel time of a transmitted pulse. For example, the round trip travel time for a one thousand foot cable is between three and four microseconds, thus, a pulse separation of ten milliseconds would be sufficient. A pulse injected at cable end A after a number of reflections from end B, which may be designated as $V_{R1}$, $V_{R2}$, $V_{R3}$, etc. Two consecutive signals $V_{R1}$ and $V_{R2}$ are necessary to obtain the attenuation of the cable. A Fourier analysis of the pulses $V_{R1}$ and $V_{R2}$ is performed by either the DSO or the microcomputer. The results are $V_{R1}(f)$ and $V_{R2}(f)$ which relate the amplitude of each signal to its frequency. The quantity a is obtained as follows:

$$a(f) = \frac{1}{2L} \ln \frac{V_{R1}(f)}{V_{R2}(f)}$$

Since a is a function of frequency, it is written as a(f). The cable length is obtained from the time separation between $V_{R1}$ and $V_{R2}$ and the velocity of propagation V of the signal. The quantity V depends on the permittivity $E_r$ (available from handbooks) of the dielectric material of the cable and is given by $$V = \frac{300}{\sqrt{E_r}} \text{ meter/microsecond}$$

The quantity b can also be determined from the Fourier analysis of $V_{R1}$ and $V_{R2}$. However, for all practical purposes, b can be obtained from $$b(f) = \frac{2\pi f}{V}$$

For explanation of a further aspect of the invention consider the voltage wave form W(t) of the PD pulse as it is generated at the defect site F of FIG. 1. This pulse travels in the cable and through the instrumentation of FIG. 1. The identified pulses $PD_D$, $PD_R$, $PD_{DR}$ and $DD_{RR}$ may be the distorted recordings of W(t) and its reflections with respect to time and thus may not be completely accurate with respect to the time interval between pulses.

The digitized version of waveform W(t) is expressed as W(n). If W(n) were then subjected to a Fast Fourier transformation it will now be identified as W(z) where z indicates a Z transform. Z-transforms are obtained by Fourier transformations.

W(z), the original PD wavelet or pulse, is subjected to both the cable transfer function H(z) and the instrument transfer function I(z) and also the reflectivity series of the PD pulses which is expressed as R(z). Therefore, X(z) = [H(z) I(z) R(z)] W(z)

where X(z) denotes the Z transform of the signal recorded by the DSO.

Let the bracket quantity be R'(z), then

X(z) = R'(z) W(z)

X(z) is then subjected to a known digital deconvolution technique to process the PD signals and their reflections to accurately pinpoint the partial discharge sites, from a knowledge of R(z), and to reconstruct the actual partial discharge signals W(z) for accurate analysis and characterization. The deconvolution techniques maybe any of Homomorphic, Predictive Autoregressive, or Analytic minimum entropy deconvolution. Such deconvolution will yield R'(z) and W(z), and R(z) may be accurately determined by $$R(z) = \frac{R'(z)}{H(z)\,I(z)}.$$

The cable transfer function H(z) is obtained as previously explained. The instrumentation transfer function I(z) is determined in the laboratory and stored in the microcomputer. The determination of R(z) provides an accurate means for locating the partial discharge site.

It may thus be seen that the objects of the invention set forth, as well as those made apparent from the foregoing description, are efficiently attained. While preferred embodiments of the invention have been set forth for purposes of disclosure, modifications to the disclosed embodiments of the invention, as well as other embodiments thereof, may occur to those skilled in the art. Accordingly, the appended claims are intended to cover all embodiments of the invention and modifications to the disclosed embodiments which do not depart from the spirit and scope of the invention.

Having thus described the invention, what is claimed is:

1. A method of detecting the locations of incipient faults in an insulated power line comprising the steps of:
    applying an excitation voltage to one end of said line at an excitation point,
    detecting a first high frequency pulse produced by a discharge in said line and transmitted on said line to the excitation point,
    detecting a first reflection of said pulse from the other end of said line, to the point of excitation,
    detecting the travel time of a reflection of said first pulse from said excitation point to said other end and return to said excitation point, and
    dividing the time between the detection of said first pulse and said first reflected pulse by said detected travel time.

2. The method of claim 1 further including the step of detecting said pulses only during a predetermined range of magnitude of the excitation voltage.

3. The method of claim 2 further including the step of detecting said pulses only above a predetermined lower amplitude and below a predetermined upper amplitude.

4. The method of claim 1 further including the step of recording the wave form received at said excitation point a multiplicity of times and averaging said recordings to reduce the noise content of said wave form.

5. The method of claim 1 further including the step of removing noise from signals received at said excitation point.

6. The method of claim 1 further including the step of detecting said pulses only above a predetermined lower amplitude and below a predetermined upper amplitude.

7. The method of claim 1 further including the step of detecting at said excitation point only signal having a frequency of fifty kHz to ten mHz.

8. The method of claim 2 including the further step of counting the number of detected pulses per unit time.

9. The method of claim 6 including the further step of counting the number of detected pulses per unit time.

10. The method of claim 1 where said cable has an outer conductor and is buried in a trench, and comprising the further steps of applying a pulse to said outer conductor, detecting said pulse and reflections thereof at said excitation point in the same manner as described for the discharge pulse, and determining the cable distance from the excitation point to the point of application of the pulse to the outer conductor.

11. The method of claim 10 further including the step of calibrating the cable length as a function of the trench length, and physically locating the pulse discharge site.

12. A method of detecting incipient faults in an insulated power line comprising the steps of:
    opening one end of said line,
    applying an excitation voltage to the other end of said line,
    providing an excitation voltage discriminator which is responsive to predetermined ranges of amplitudes of the excitation voltage,
    applying said excitation voltage or a representation thereof to said discriminator,
    receiving high frequency pulses produced by a discharge in said line due to said excitation voltage,
    applying the high received frequency pulses to said discriminator,
    and detecting by said discriminator, only those high frequency pulses produced by a discharge in said line due to said excitation voltage which are in a predetermined range of amplitude of said excitation voltage.

13. The method of claim 12 further including the step of detecting said pulses only above a predetermined lower amplitude and below a predetermined upper amplitude.

14. The method of claim 12 further including the step of removing noise from signals received at said excitation point.

15. The method of claim 12 further including the step of detecting said pulses only above a predetermined amplitude.

16. The method of claim 12 further including the step of detecting at said excitation point only signal having a frequency of fifty kHz to ten mHz.

17. The method of claim 15 including the further step of counting the number of detected pulses per unit time.

18. Apparatus for detecting incipient faults in an insulated power line comprising:
    means for applying an excitation voltage to one end of said line,
    means for receiving at said one end high frequency signals produced by partial discharges at incipient fault sites in said cable and reflections thereof at both ends of said cable,
    an excitation voltage discriminator,
    means for applying received high frequency signals to said discriminator, and
    means for applying the excitation voltage or a sample thereof to said discriminator, said discriminator being effective to detect said high frequency signals only within predetermined ranges of magnitudes of said excitation voltage.

19. The apparatus of claim 18 further including means responsive to said voltage discriminator for further detecting signals from pulse discharge site only above a predetermined amplitude.

20. A method of detecting the locations of incipient faults in an insulated power line comprising the steps of:
    applying an excitation voltage to one end of said line at an excitation point;
    detecting a first high frequency pulse produced by a discharge in said line and transmitted on said line to the excitation point;
    detecting a first reflection of said pulse from the other end of said line, to the point of excitation;

detecting the travel time of a reflection of said first pulse from said excitation point to said other end and return to said excitation point;

dividing the time between the detection of said first pulse and said first reflected pulse by said detected travel time, determining the transfer function of the power line; and utilizing said transfer function to determine the location of the partial discharge in the line.

21. The method of claim 20 including the steps of recording the partial discharge wave form, digitizing the recorded wave form, and filtering the digitized wave form prior to utilizing said transfer function to determine the location of the partial discharge in the line.

22. The method of claim 20 including the step of detecting said pulses only during a predetermined range of magnitude of the excitation voltage.

23. The method of claim 22 including the step of detecting said pulses only above a predetermined lower amplitude and below a predetermined upper amplitude.

24. The method of claim 20 including the step of removing noise from signals received at said excitation point.

25. The method of claim 20 including the step of detecting said pulses only above a predetermined lower amplitude and below a predetermined upper amplitude.

26. The method of claim 20 including the step of detecting at said excitation point only signals having a frequency of fifty kHz to ten mHz.

27. The method of claim 22 including the step of counting the number of detected pulses per unit time.

28. The method of claim 25 including the step of counting the number of detected pulses per unit time.

29. The method of claim 20 where said cable has an outer conductor and is buried in a trench, and comprising the further steps of applying a pulse to said outer conductor, detecting said pulse and reflections thereof at said excitation point in the same manner as described for the discharge pulse, and determining the cable distance from the excitation point to the point of application of the pulse to the outer conductor.

30. The method of claim 29 further including the step of calibrating the cable length as a function of the trench length, and physically locating the pulse discharge site.

* * * * *